US008673076B2

(12) United States Patent
Nakaiso (10) Patent No.: US 8,673,076 B2
(45) Date of Patent: *Mar. 18, 2014

(54) SUBSTRATE PROCESSING APPARATUS AND SEMICONDUCTOR DEVICE PRODUCING METHOD

(75) Inventor: Naoharu Nakaiso, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 984 days.

This patent is subject to a terminal disclaimer.

(21) Appl. No.: 12/578,012

(22) Filed: Oct. 13, 2009

(65) Prior Publication Data

US 2010/0081288 A1  Apr. 1, 2010

Related U.S. Application Data (62) Division of application No. 10/549,933, filed as application No. PCT/JP2004/011266 on Aug. 5, 2004, now Pat. No. 7,622,007.

(30) Foreign Application Priority Data

Aug. 7, 2003  (JP) .................................. 2003-206526

(51) Int. Cl.
  *C23C 16/22*   (2006.01)
  *C23C 16/24*   (2006.01)
  *C23C 16/455*  (2006.01)

(52) U.S. Cl.
USPC ..... 118/715; 118/725; 438/758; 257/E21.485

(58) Field of Classification Search
USPC ............ 118/715, 725; 438/758; 257/E21.485
See application file for complete search history.

(56) References Cited

U.S. PATENT DOCUMENTS

| 4,992,301 | A   | * | 2/1991 | Shishiguchi et al. | ......... 118/724 |
| 5,654,230 | A   | * | 8/1997 | Jintate et al. | .................. 438/684 |
| 6,383,300 | B1  |   | 5/2002 | Saito et al. | |
| 6,435,865 | B1  | * | 8/2002 | Tseng et al. | .................. 432/152 |
| 2003/0024477 | A1 | * | 2/2003 | Okuda et al. | ............. 118/723 IR |
| 2004/0025786 | A1 |   | 2/2004 | Kontani et al. | |

FOREIGN PATENT DOCUMENTS

| JP | 02025576 | * | 1/1990 |
| JP | 5-198517 A | | 8/1993 |
| JP | 8-213330 A | | 8/1996 |
| JP | 9-102463 A | | 4/1997 |
| JP | 2000-68214 A | | 3/2000 |
| JP | 2000-306916 A | | 11/2000 |
| JP | 2001-252604 | | 9/2001 |
| JP | 2002-118066 A | | 4/2002 |
| JP | 2002-353211 A | | 12/2002 |
| JP | 2003-017422 A | | 1/2003 |
| JP | 2003-045811 A | | 2/2003 |
| JP | 2003-45864 A | | 2/2003 |

(Continued)

*Primary Examiner* — Jeffrie R Lund
*Assistant Examiner* — Satish Chandra
(74) *Attorney, Agent, or Firm* — Birch, Stewart, Kolasch & Birch, LLP (57) ABSTRACT

Disclosed is a substrate processing apparatus which comprises reaction tubes (3,4) for processing multiple substrates (27), a heater (5) for heating the substrates, and gas introducing nozzles (6,7,8,9,10) for supplying a gas into the reaction tubes. Each of the gas introducing nozzles (6,7,8,9) is structured so that at least the channel cross section of a portion facing the heater (5) is larger than those of the other portions.

14 Claims, 8 Drawing Sheets

(56) References Cited

FOREIGN PATENT DOCUMENTS

| JP | 2004-134466 A | 4/2004 |
| JP | 2005-286005 | 10/2005 |
| WO | WO-00/15868 A1 | 3/2000 |
| WO | WO-2004/034454 A1 | 4/2004 |

* cited by examiner

SUBSTRATE PROCESSING APPARATUS AND SEMICONDUCTOR DEVICE PRODUCING METHOD

CROSS-REFERENCE

This application is a Divisional of co-pending application Ser. No. 10/549,933 filed on Sep. 20, 2005, and for which priority is claimed under 35 U.S.C. §120. The co-pending application Ser. No. 10/549,933 is a national stage application of PCT/JP2004/011266, filed Aug. 5, 2004. This application also claims priority of Application No. 2003-206526 filed in Japan on Aug. 7, 2003 under 35 U.S.C. §119. The entire contents of all of the above applications are hereby incorporated by reference.

TECHNICAL FIELD

The present invention relates to a substrate processing apparatus, and more particularly, to a substrate processing apparatus such as a vertical CVD (Chemical Vapor Deposition) apparatus which produces a semiconductor device such as an IC on a substrate such as a silicon wafer.

BACKGROUND ART

As the substrate processing apparatus, there is a batch type substrate processing apparatus which processes a necessary number of substrates at a time, e.g., a vertical CVD apparatus which has a vertical reaction furnace and which processes a necessary number of substrates at a time.

For producing semiconductor devices, a batch type vertical hot wall decompression CVD apparatus is widely used for forming a CVD film such a polycrystalline silicon film, a silicon nitride film and the like on a substrate (wafer).

A general batch type vertical hot wall decompression CVD apparatus includes a reaction tube comprising an inner tube and an outer tube which is concentric with the inner tube, a heater which is disposed such as to surround the outer tube and which heats the inside of the reaction tube, a gas introducing nozzle through which reaction gas is introduced into the inner tube, and a vertical furnace comprising an exhaust port or the like through which the reaction tube is evacuated. A necessary number of multi-stacked wafers are held in their horizontal postures and in this state, the wafers are brought into the inner tube from below. Reaction gas is introduced into the inner tube through the gas introduction nozzle, and the inside of the reaction tube is heated by the heater, thereby forming CVD films on the wafers.

As such a conventional substrate processing apparatus, there is a vertical CVD apparatus as described in Japanese Patent Application Laid-open No. 2000-68214 for example.

This vertical CVD apparatus includes a plurality of reaction gas supply nozzles as the gas introducing nozzle. A quartz tube having ¼ inch diameter (outer diameter) is used as the reaction gas supply nozzle. Each reaction gas supply nozzle comprises a horizontal portion which is inserted below the inner tube from the horizontal direction, and a vertical portion which extends upward along an inner surface of the inner tube, and the reaction gas supply nozzle is formed into L-shape. The vertical portion is provided in a gap between the inner tube, a boat and a wafer held by the boat. An upper end of the vertical portion is opened. Lengths of vertical portions of the respective reaction gas supply nozzles are different from one another in stages so that reaction gas can be dispersed and supplied into the inner tube.

Figure 13:
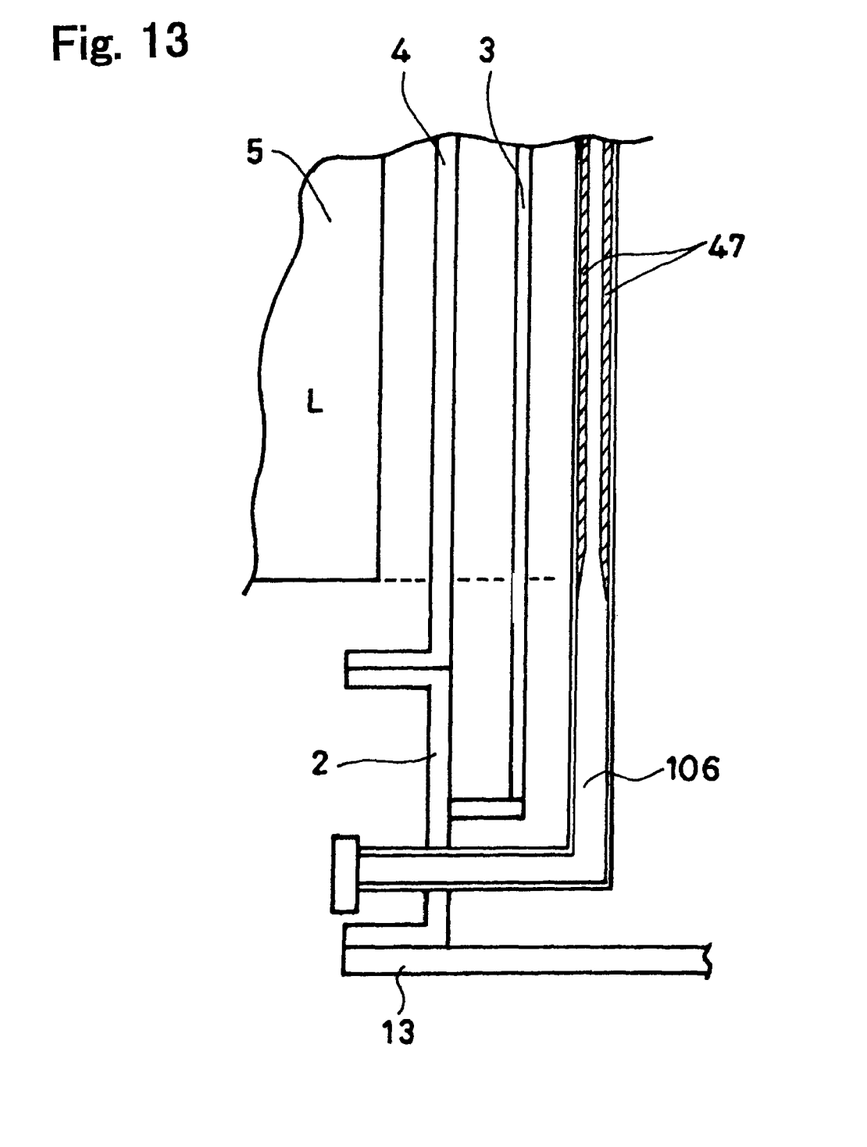
FIG. 13 is a schematic partial longitudinal sectional view for explaining a conventional vertical CVD apparatus.

When a CVD film is to be formed on a wafer, a reaction product is formed not only on the wafer surface, but is also adhered to and deposited on an inner surface of the inner tube 3 or an interior of the reaction gas supply nozzle 106 as shown in FIG. 13. Especially a portion of the reaction gas supply nozzle 106 that is opposed to the heater 5 is heated by the heater 5 and thus, there is a high tendency that the reaction product 47 is adhered to and deposited on this portion of the reaction gas supply nozzle 106. Further, since the pressure in the reaction gas supply nozzle 106 is higher than the pressure outside of the nozzle 106, a reaction product 47 adhered to an inner wall of the nozzle 106 is three to four times thicker than a reaction product adhered to an outer wall of the nozzle 106. For this reason, when a flat polycrystalline silicon film (this will be described later) having about 5,000 to 10,000 Å thickness is to be formed using a quartz tube having ¼ inch diameter (outer diameter) as the nozzle 106, the nozzle 106 is clogged during processing of three to four batches. In this case, cleaning of the nozzle can not be carried out, and the only way is to replace the nozzle 106 with a clean one every three to four times batch processing. Therefore, maintenance operation such as cleaning of the reaction gas supply nozzle must frequently be carried out under the necessity, and this deteriorates the rate of operation and throughput of the substrate processing apparatus.

In view of such circumstances, it is a main object of the present invention to prevent a gas introducing nozzle from being clogged soon even if a thick film such as a thick polycrystalline silicon film is formed, to elongate a maintenance cycle, to reduce downtime of the apparatus, to lighten the maintenance operation, and to enhance the throughput.

DISCLOSURE OF THE INVENTION

According to an aspect of the present invention, there is provided a substrate processing apparatus characterized by comprising:

a reaction container which processes a plurality of substrates;

a heater which heats said plurality of substrates; and at least one nozzle through which reaction gas is supplied into said reaction container, wherein said nozzle is attached to said reaction container with said nozzle penetrating a wall of said reaction container, and a flow-path cross-sectional area of a portion of said nozzle that is opposed to at least said heater is greater than a flow-path cross-sectional area of the nozzle-attaching portion.

According to another aspect of the present invention, there is provided a producing method of a semiconductor device characterized by comprising:

a step for transferring a substrate or a substrates into a reaction container, a step for processing the substrate or substrates by supplying reaction gas into a reaction container through a nozzle which is attached to said reaction container such that the nozzle penetrates a wall of the reaction container and in which a flow-path cross-sectional area of a portion of the nozzle opposed to at least a heater is greater than a flow-path cross-sectional area of the attaching portion, and a step for transferring the processed substrate or substrates out from the reaction container.

PREFERABLE MODE FOR CARRYING OUT THE INVENTION

A preferred embodiment of the present invention will be explained with reference to the drawings below.

Usually, when a polycrystalline silicon film is to be formed, $SiH_4$ is supplied as reaction gas from a reaction gas supply nozzle. An inside of a furnace is heated to 610° C., the pressure in the furnace is maintained at 26.6 Pa and the film is formed.

A flat polycrystalline silicon film is formed for a back seal of a silicon wafer in some cases. In this case, the processing temperature is higher by 30° C. to 50° C. as compared with normal processing, and this film is formed thicker than the polycrystalline silicon film.

This preferable embodiment of the invention is suitably used for forming such polycrystalline silicon film and flat polycrystalline silicon film and among them, this embodiment is suitably used for forming especially the flat polycrystalline silicon film.

Figure 1:
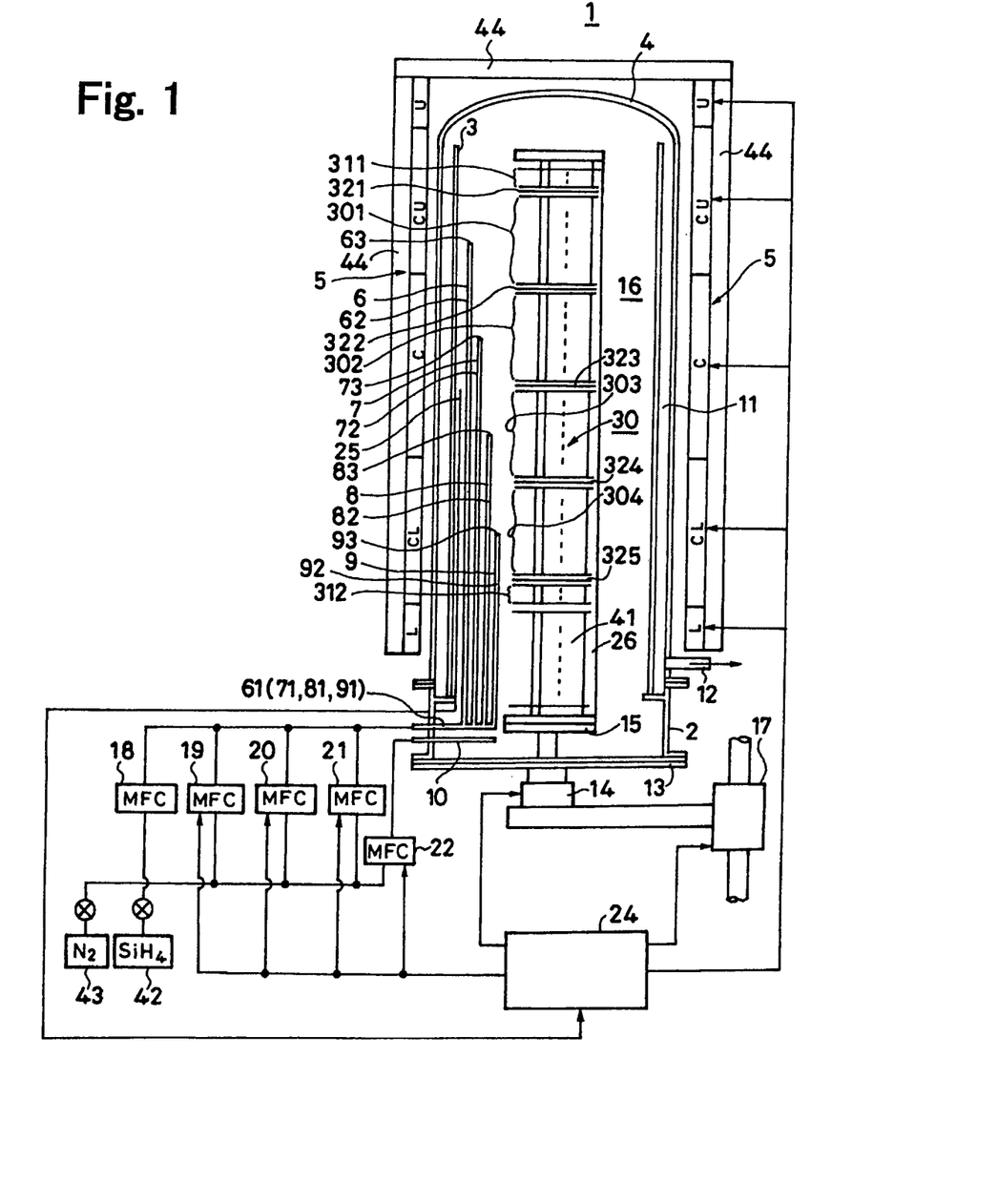
FIG. 1 is a schematic longitudinal sectional view for explaining a vertical CVD apparatus according to one example of the present invention.
Figure 2:
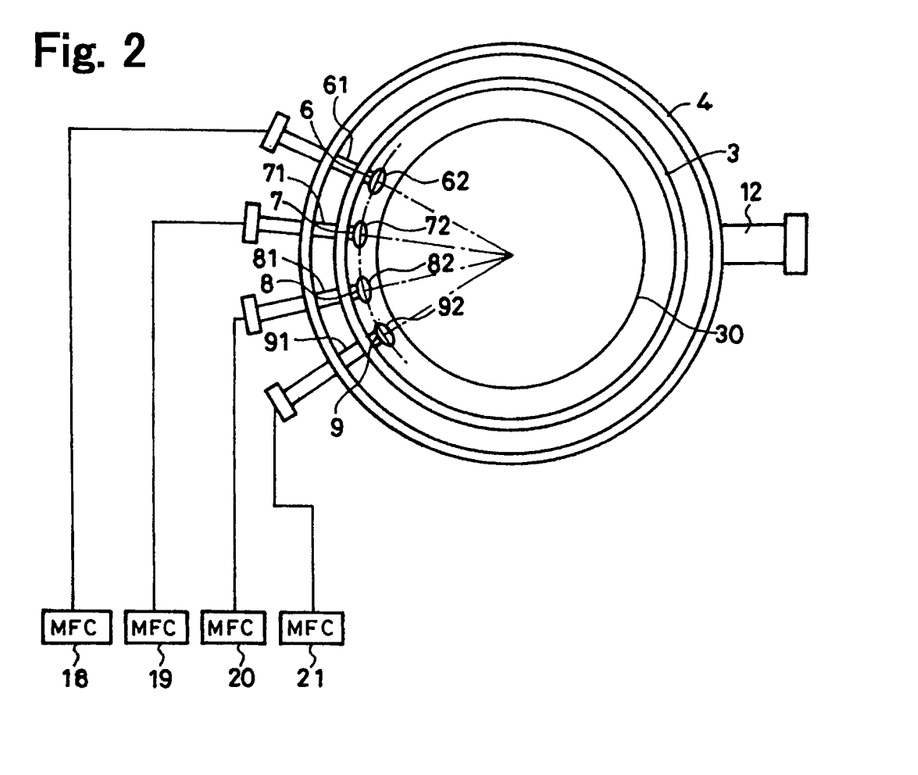
FIG. 2 is a transversal sectional view for explaining the vertical CVD apparatus according to the one example of the present invention.

FIG. 1 schematically shows a batch type vertical CVD apparatus which is one of substrate processing apparatuses, especially a CVD apparatus which forms a flat polycrystalline silicon film, especially a reaction furnace 1. FIG. 2 is a schematic transverse sectional view for explaining especially the outline of the reaction furnace 1.

Here, the term "flat" means that the temperature gradient in the furnace is set flat (substantially zero). Therefore, flat polycrystalline silicon films are polycrystalline silicon films formed on a plurality of substrates disposed in a furnace in which the temperature gradient is set flat. When the flat polycrystalline silicon film is to be formed, film-forming gas is uniformly supplied to the entire region in the furnace in which a plurality of substrates are disposed and thus, a film-forming gas nozzle called a long nozzle is used. Here, the term "long nozzle" means a film-forming gas nozzle capable of supplying film-forming gas not from outside of a region in the furnace where a plurality of substrates are disposed but from inside of the region in the furnace where the substrates are disposed. In the reaction furnace of the vertical CVD apparatus, since this long nozzle is usually inserted from a lower portion of the furnace and is extended toward an upper portion of the furnace, the long nozzle is longer than a normal nozzle which is inserted from the lower portion within the furnace and terminated therein. To form the flat polycrystalline silicon film, a plurality of, e.g., four quartz long nozzles which extend along a region in the furnace where the plurality of substrates are disposed and which have different lengths are used.

With reference to FIGS. 1 and 2, an upper portion of an evacuation air-tight chamber (not shown) such as a load lock chamber is air-tightly provided with a stainless steel furnace opening flange 2 which forms a furnace opening. An inner tube 3 is concentrically supported at a desired position of an inner surface of the furnace opening flange 2, an outer tube 4 is provided on an upper end of the furnace opening flange 2 concentrically with the inner tube 3. A cylindrical heater 5 is provided concentrically with the outer tube 4 such as to surround the outer tube 4. Heat insulators 44 are provided such as to cover a periphery and an upper portion of the heater 5. The heater 5 is divided into five zones, i.e., U, CU, C, CL and L. When substrates are to be processed, a main control unit 24 controls such that temperatures of the five zones become the same (temperature gradient becomes flat in the vertical direction). A lower end of the furnace opening flange 2 is air-tightly closed by a seal cap 13.

The inner tube 3 is of cylindrical shape whose upper and lower ends are opened. The inner tube 3 is made of quartz or silicon carbide which has heat resistance property and which does not contaminate wafers. The wafers are heated equally by accumulating heat from the heater 5, thereby equalizing heating effect of wafers. The outer tube 4 is of a bottomed cylindrical shape having an opened lower end and a closed upper end. Like the inner tube 3, the outer tube 4 is made of quartz or silicon carbide.

A boat 26 is provided in the inner tube 3. A plurality of wafers 30 are loaded on the boat 26 in their horizontal postures. Predetermined gaps are provided between the wafers 30. The boat 26 is mounted on a boat-receiving stage 15 mounted on the seal cap 13. The seal cap 13 on which the boat 26 is mounted moves upward, and the lower end of the furnace opening flange 2 is air-tightly closed. In this state, the wafers 30 loaded on the boat 26 are located at predetermined positions. A plurality of heat insulative plates 41 are placed on a lower portion of the boat 26, 5 to 10 dummy wafers 312 are placed thereon, one monitor wafer 325 is placed thereon, 25 product wafers 304 are placed thereon, one monitor wafer 324 is placed thereon, 25 product wafers 303 are placed thereon, one monitor wafer 323 is placed thereon, 25 product wafers 302 are placed thereon, one monitor wafer 322 is placed thereon, 25 product wafers 301 are placed thereon, one monitor wafer 321 is placed thereon, and 5 to 10 dummy wafers 311 are placed thereon.

The inner tube 3 and the outer tube 4 constitute a reaction tube. The furnace opening flange 2, the inner tube 3, the outer tube 4, the heater 5 and the like constitute a vertical furnace. A processing chamber 16 is defined in the inner tube 3. A cylindrical gas discharge passage 11 is defined between the inner tube 3 and the outer tube 4. The reaction tubes 3 and 4, the furnace opening flange 2, the seal cap 13 and the like constitute the reaction container.

A plurality of (four in the drawing) gas introducing nozzles 6, 7, 8 and 9 air-tightly penetrate a wall of the furnace opening flange 2 from the horizontal direction, and extend upward along an inner surface of the inner tube 3, preferably in parallel to an axis of the inner tube 3. The gas introducing nozzles 6, 7, 8 and 9 are made of quartz, and upper ends of the gas introducing nozzles 6, 7, 8 and 9 are opened as gas ejection ports 63, 73, 83 and 93, respectively. Reaction gas is introduced into the inner tube 3 through the gas introducing nozzles 6, 7, 8 and 9. The gas introducing nozzles 6, 7, 8 and 9 penetrate the wall of the furnace opening flange 2 at the same height in the horizontal direction but lengths of the gas introducing nozzles 6, 7, 8 and 9 are different from one another. The gas introducing nozzles 6, 7, 8 and 9 respectively comprise tube shaft intersecting portions 61, 71, 81 and 91 which intersect with an axis of the reaction tube, and a tube shaft parallel portions 62, 72, 82 and 92 provided along a tube inner surface in parallel to the axis of the reaction tube. Lengths of the tube shaft parallel portions 62, 72, 82 and 92 are different from one another in stages. As a result, heights of upper end positions (gas ejection ports 63, 73, 83 and 93) of the gas introducing nozzles 6, 7, 8 and 9 are different from one another in stages.

The reason why the heights of the gas ejection ports 63, 73, 83 and 93 of the upper ends of the gas introducing nozzles 6, 7, 8 and 9 is that in order to secure the uniformity of film thicknesses of the plurality of wafers 30 while setting the temperature gradient in a direction along the tube axis in the reaction furnace 1 to zero, it is necessary to divide a region where the plurality of wafers 30 are disposed into four zones (product wafers 301, 302, 303 and 304), to allow the plurality of gas introducing nozzles 6, 7, 8 and 9 to extend into the reaction furnace 1 such as to correspond to the divided zones respectively, and to supply the reaction gas therefrom.

The gas ejection ports 63, 73, 83 and 93 of the upper ends of the gas introducing nozzles 6, 7, 8 and 9 are disposed at equal distances from one another. The gas ejection ports 63, 73, 83 and 93 are located in the vicinity of central portions of arrangement regions of product wafers 301, 302, 303 and 304 on which 25 wafers are stacked, respectively. Since the gas ejection ports 63, 73, 83 and 93 of the upper ends of the gas introducing nozzles 6, 7, 8 and 9 are positioned such as to respectively correspond to the product wafers 301, 302, 303 and 304 of the four zones in the processing chamber 16, reaction gas is equally supplied to the plurality of wafers 30.

Reaction gas is consumed by forming films, but since the gas ejection ports 63, 73, 83 and 93 of the upper ends of the gas introducing nozzles 6, 7, 8 and 9 are opened upward in stages, reaction gas is introduced in succession to compensate the consumed reaction gas. The reaction gas is introduced in equal concentrations from the lower portion to the upper portion of the processing chamber 16 and as a result, film thicknesses of the wafers 30 are equalized.

As shown in FIG. 2, the gas introducing nozzles 6, 7, 8 and 9 are disposed on the same circumference at equal distances from one another along the inner surface of the inner tube 3. To facilitate the understanding of explanation, the inner tube 3 is disposed in the radial direction in FIG. 1. A gas introduction nozzle 10 is a straight nozzle which intersects with the tube axis. The gas introduction nozzle 10 is made of quartz like the gas introducing nozzles 6, 7, 8 and 9.

Figure 3:
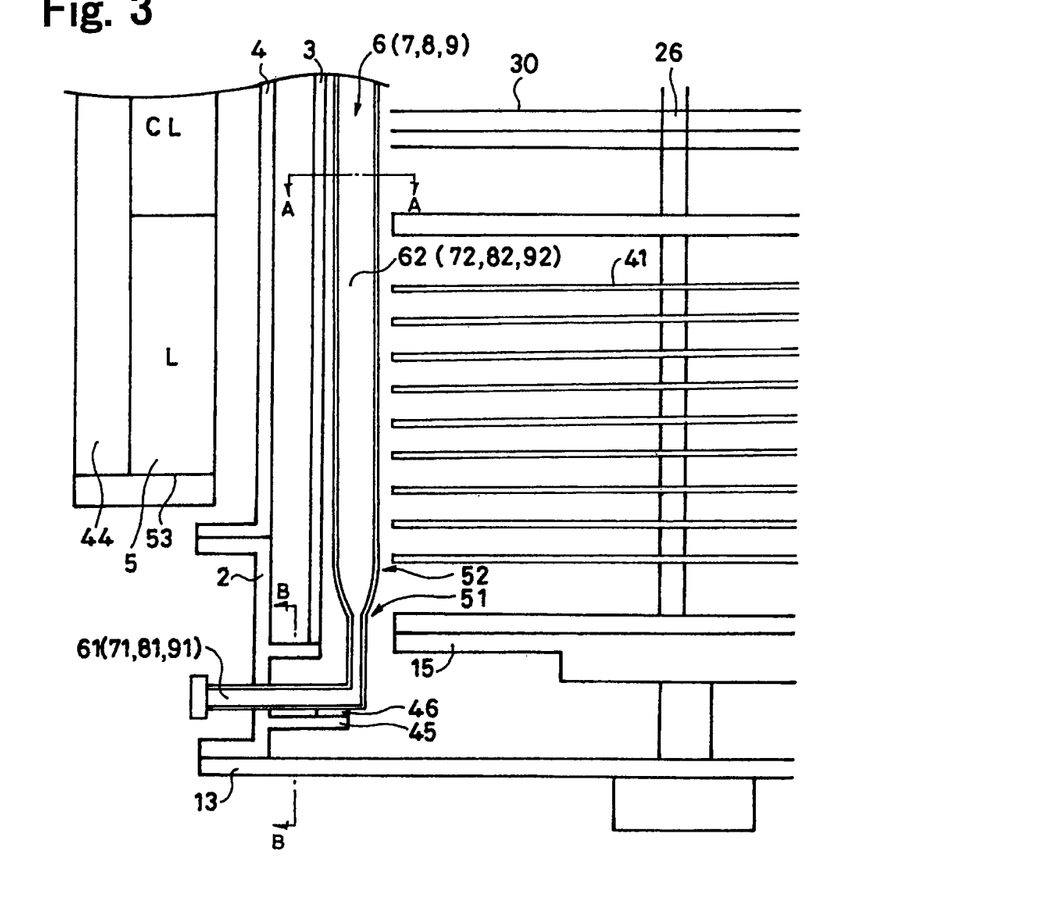
FIG. 3 is a partially enlarged longitudinal sectional view of FIG. 1.
Figure 4A:
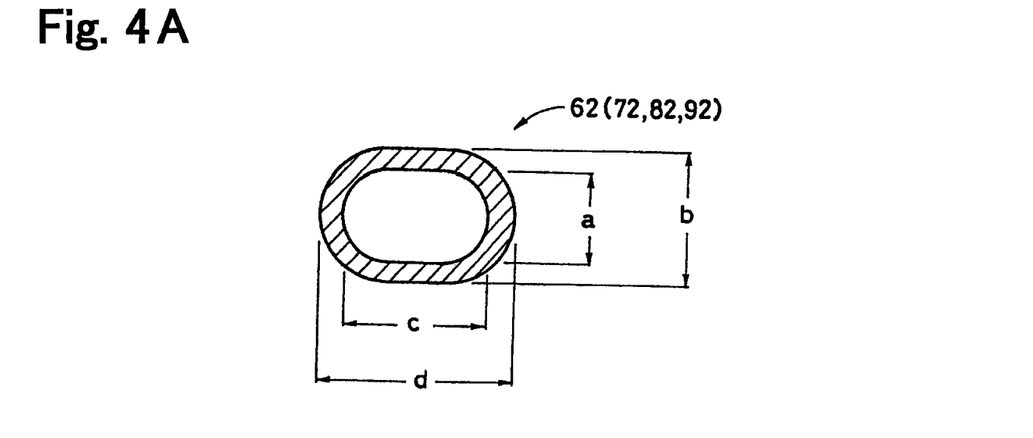
FIG. 4A is a sectional view taken along a line A-A in FIG. 3.
Figure 4B:
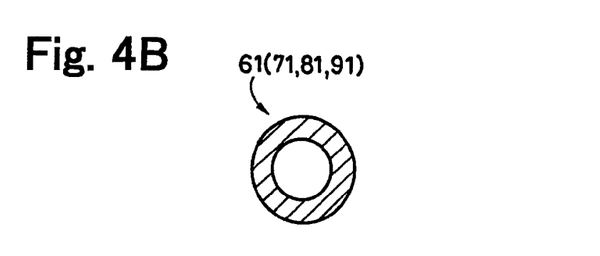
FIG. 4B is a sectional view taken along a line B-B in FIG. 3.

As shown in FIGS. 3, 4A and 4B, the tube shaft intersecting portions 61, 71, 81 and 91 of the gas introducing nozzles 6, 7, 8 and 9 have small diameters (small flow-path cross sections). Portions of the tube shaft parallel portions 62, 72, 82 and 92 which are opposed at least to the heater 5 have large diameters (large flow-path cross sections). A flow-path cross-sectional area of the large-diameter portion is preferably at least two times or more of the flow-path cross-sectional area of the small-diameter portion.

Concerning a method for obtaining the large flow-path cross section, inner diameters of the tube shaft parallel portions 62, 72, 82 and 92 are increased with respect to the tube shaft intersecting portions 61, 71, 81 and 91. If the diameters of the tube shaft intersecting portions 61, 71, 81 and 91 are reduced to small values (in this embodiment, ¼ inches, the same as the conventional outer diameter), this method can be carried out without largely modifying the existing substrate processing apparatus. As shown in FIGS. 4A and 4B, the cross-sectional shapes of the tube shaft parallel portions 62, 72, 82 and 92 are formed into a long circle or ellipse (elliptic shape) having long shaft in the circumferential direction. In this case, outer diameters of thereof in the directions of the short axes are set to the same sizes as those of the tube shaft intersecting portions 61, 71, 81 and 91, or determined so that the tube shaft parallel portions 62, 72, 82 and 92 do not interfere with the boat 26 and the wafer 30 while taking into consideration the inner tube 3 and the boat 26, as well as the gaps between the wafers 30 held by the boat 26. In this embodiment, the cross sections of the tube shaft intersecting portions 61, 71, 81 and 91 are circular having outer diameters of 5 to 7 mm and inner diameters of 3 to 5 mm. Outer diameters "b" of the tube shaft parallel portions 62, 72, 82 and 92 in the short axis direction are 7 to 9 mm, and inner diameters "a" are 5 to 7 mm. Outer diameters "d" of the tube shaft parallel portions 62, 72, 82 and 92 in the long axis direction are 10 to 12 mm, and inner diameters "c" are 8 to 10 mm.

In this embodiment, the inner diameters of the tube shaft parallel portions 62, 72, 82 and 92 are increased with certain inclination from a portion 51 at which the inner diameters start increasing, and the inner diameters become constant from a portion 52. This portion 52 is located lower than a lower end 53 of the heater 5. The portion 51 at which the inner diameters start increasing is located lower than the heater 5, the outer tube 4 and the heat insulative plates 41, and is higher than lower ends of the boat-receiving stage 15 and the inner tube 3, and is located within a region opposed to the furnace opening flange 2.

Figure 7:
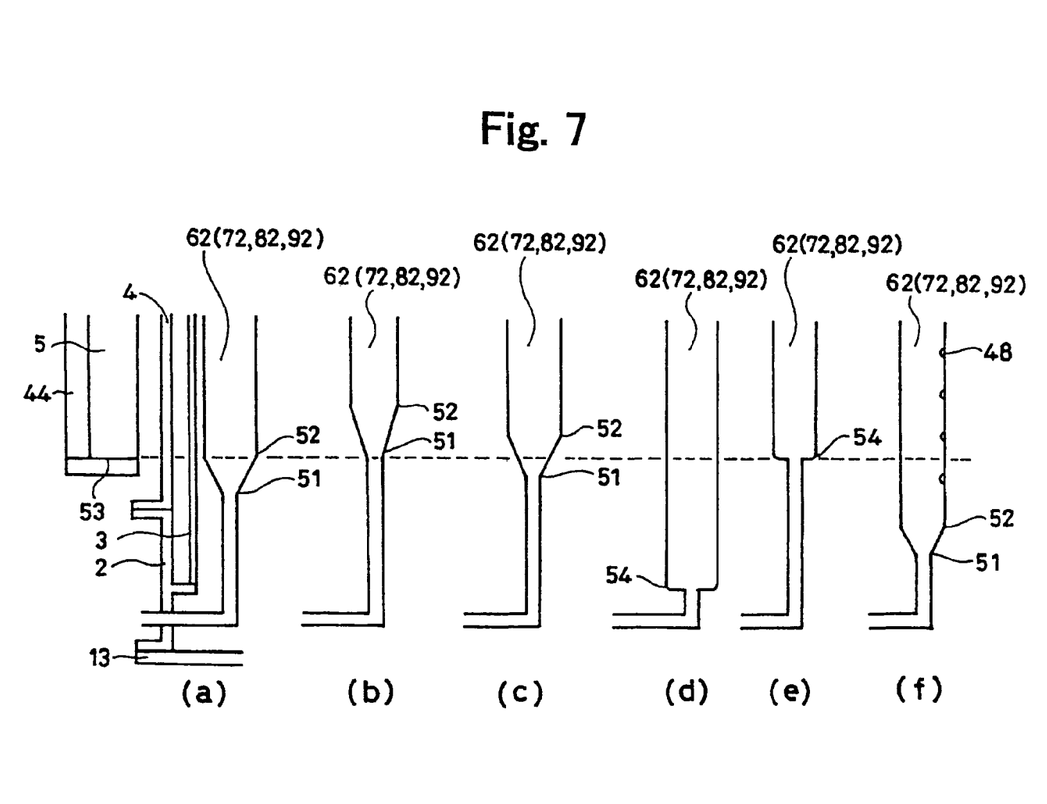
FIG. 7 is a schematic partial vertical sectional view for explaining a modification of the gas introduction nozzle.
Figure 8A:
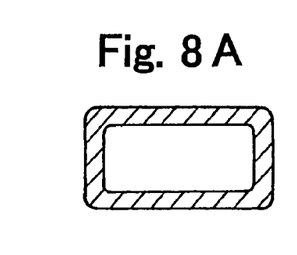
FIG. 8A is a sectional view taken along a line A-A in FIG. 3 for explaining a modification of the gas introduction nozzle.
Figure 8B:
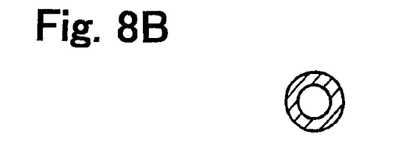
FIG. 8B is a sectional view taken along a line B-B in FIG. 3 for explaining a modification of the gas introduction nozzle.
Figure 9A:
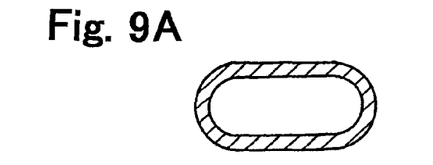
FIG. 9A is a sectional view taken along a line A-A in FIG. 3 for explaining a modification of the gas introduction nozzle.
Figure 9B:
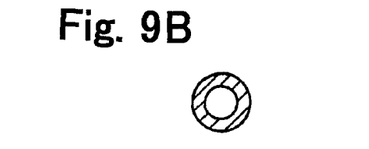
FIG. 9B is a sectional view taken along a line B-B in FIG. 3 for explaining a modification of the gas introduction nozzle.
Figure 10A:
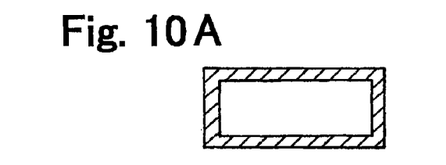
FIG. 10A is a sectional view taken along a line A-A in FIG. 3 for explaining a modification of the gas introduction nozzle.
Figure 10B:
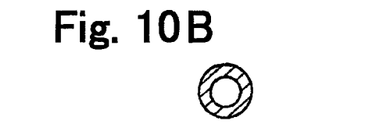
FIG. 10B is a sectional view taken along a line B-B in FIG. 3 for explaining a modification of the gas introduction nozzle.
Figure 11A:
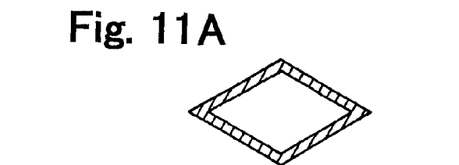
FIG. 11A is a sectional view taken along a line A-A in FIG. 3 for explaining a modification of the gas introduction nozzle.
Figure 11B:
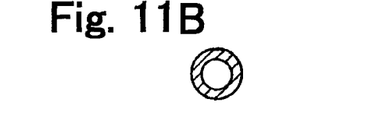
FIG. 11B is a sectional view taken along a line B-B in FIG. 3 for explaining a modification of the gas introduction nozzle.
Figure 12A:
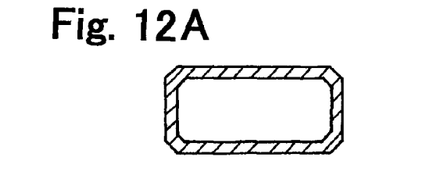
FIG. 12A is a sectional view taken along a line A-A in FIG. 3 for explaining a modification of the gas introduction nozzle.
Figure 12B:
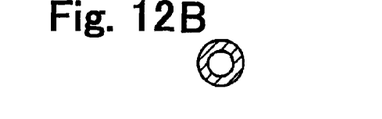
FIG. 12B is a sectional view taken along a line B-B in FIG. 3 for explaining a modification of the gas introduction nozzle.

As shown in FIG. 7, the portion 52 at which the inner diameters finish increasing may be at substantially the same height as the lower end 53 of the heater 5 (see (a)), the portion 51 at which the inner diameters start increasing may be at substantially the same height as the lower end 53 of the heater 5 (see (b)), and a portion at which the inner diameters are increasing may be at substantially the same height as the lower end 53 of the heater 5 (see (c)). The inner diameters of the tube shaft parallel portions 62, 72, 82 and 92 may not be increased with the certain inclination from the portion 51 at which the inner diameters start increasing, but the inner diameters may be increased suddenly at the portion 54. In this case, the portion 54 may be lower than the lower end 53 of the heater 5 (see (d)), or may be substantially at the same height as the lower end 53 of the heater 5 (see (e)). The upper ends of the tube shaft parallel portions 62, 72, 82 and 92 may not be provided with the gas ejection ports 63, 73, 83 and 93. Alternatively, porous nozzles (see (f)) provided a plurality of gas ejection ports 48 on side surfaces of the tube shaft parallel portions 62, 72, 82 and 92 may be used. In this case, positions of the portions 51 and 52 are the same as those of the gas introducing nozzles 6, 7, 8 and 9.

Referring back to FIG. 3, the tube shaft parallel portions 62, 72, 82 and 92 and the tube shaft intersecting portions 61, 71, 81 and 91 may be connected to each other as separate parts or they may be integrally formed together.

Cushion members 46 are respectively mounted on lower portions of the tube shaft intersecting portions 61, 71, 81 and 91. The cushion members 46 are in contact with a metal ring nozzle support member 45 which is mounted such as to project inward from a wall of the furnace opening flange 2.

The furnace opening flange 2 is provided with an exhaust tube 12 which is in communication with a lower end of the gas discharge passage 11. Reaction gas introduced from the gas introducing nozzles 6, 7, 8, 9 and 10 flows upward in the inner tube 3, the reaction gas is turned back at the upper end of the inner tube 3, and flows downward in the gas discharge passage 11, and is discharged out from the exhaust tube 12.

Referring back to FIG. 1, an opening (furnace opening) of the lower end of the furnace opening flange 2 is air-tightly closed with the seal cap 13. The seal cap 13 is provided with a boat-rotating apparatus 14. The boat 26 stands on the boat-receiving stage 15 which is rotated by the boat-rotating apparatus 14. The seal cap 13 is supported by a boat elevator 17 such that the seal cap 13 can move vertically.

The gas introducing nozzles 6, 7, 8, 9 and 10 are connected to a reaction gas supply source 42 which supplies reaction gas such as $SiH_4$ or the like, or are connected to a purge gas supply source 43 which supplies inert gas such as nitrogen gas respectively through mass flow controllers 18, 19, 20, 21 and 22 as flow rate controllers.

The main control unit 24 control the heating operation of the heater 5, the vertical movement of the boat elevator 17, rotation of the boat-rotating apparatus 14, and flow rates of the mass flow controllers 18, 19, 20, 21 and 22. A temperature detection signal from one or more temperature detectors 25 which detect the temperature in the furnace is input to the main control unit 24, and the heater 5 is controlled such that the heater 5 equally heats inside of the furnace.

The operation will be explained below.

The boat 26 is lowered by the boat elevator 17, and wafers 27 are loaded on the lowered boat 26 by a substrate loader (not shown). In a state in which a predetermined number of wafers 27 are loaded, the boat elevator 17 moves the seal cap 13 upward to bring the boat 26 into the processing chamber 16. The processing chamber 16 is air-tightly closed with the seal cap 13, the processing chamber 16 is decompressed to a processing pressure through the exhaust tube 12, and the processing chamber 16 is heated to the processing temperature by the heater 5. The boat 26 is rotated around the vertical axis by the boat-rotating apparatus 14.

The mass flow controllers 18, 19, 20, 21 and 22 control the flow rate of the reaction gas ($SiH_4$), and the reaction gas is introduced into the processing chamber 16 through the gas introducing nozzles 6, 7, 8, 9 and 10. The reaction gas ($SiH_4$) may be 100% $SiH_4$ and introduced alone, or $SiH_4$ may be diluted with $N_2$ and introduced.

During the process in which reaction gas flows upward in the processing chamber 16, reaction product is deposited on the wafers 27 by thermochemical reaction and films are formed. Since the boat 26 is rotated, the reaction gas is prevented from unevenly flowing with respect to the wafers 27.

Reaction gas is consumed by forming films, but since the upper end positions (gas introducing positions) of the gas introducing nozzles 6, 7, 8 and 9 are opened upward in stages, reaction gas is introduced in succession to compensate the consumed reaction gas. The reaction gas is introduced in equal concentrations from the lower portion to the upper portion of the processing chamber 16. Therefore, film thicknesses of the wafers are equalized.

The mass flow controllers 18, 19, 20, 21 and 22 control the amount of gas to be introduced from the gas introducing nozzles 6, 7, 8, 9 and 10 such that the concentration of reaction gas becomes constant.

Figure 6:
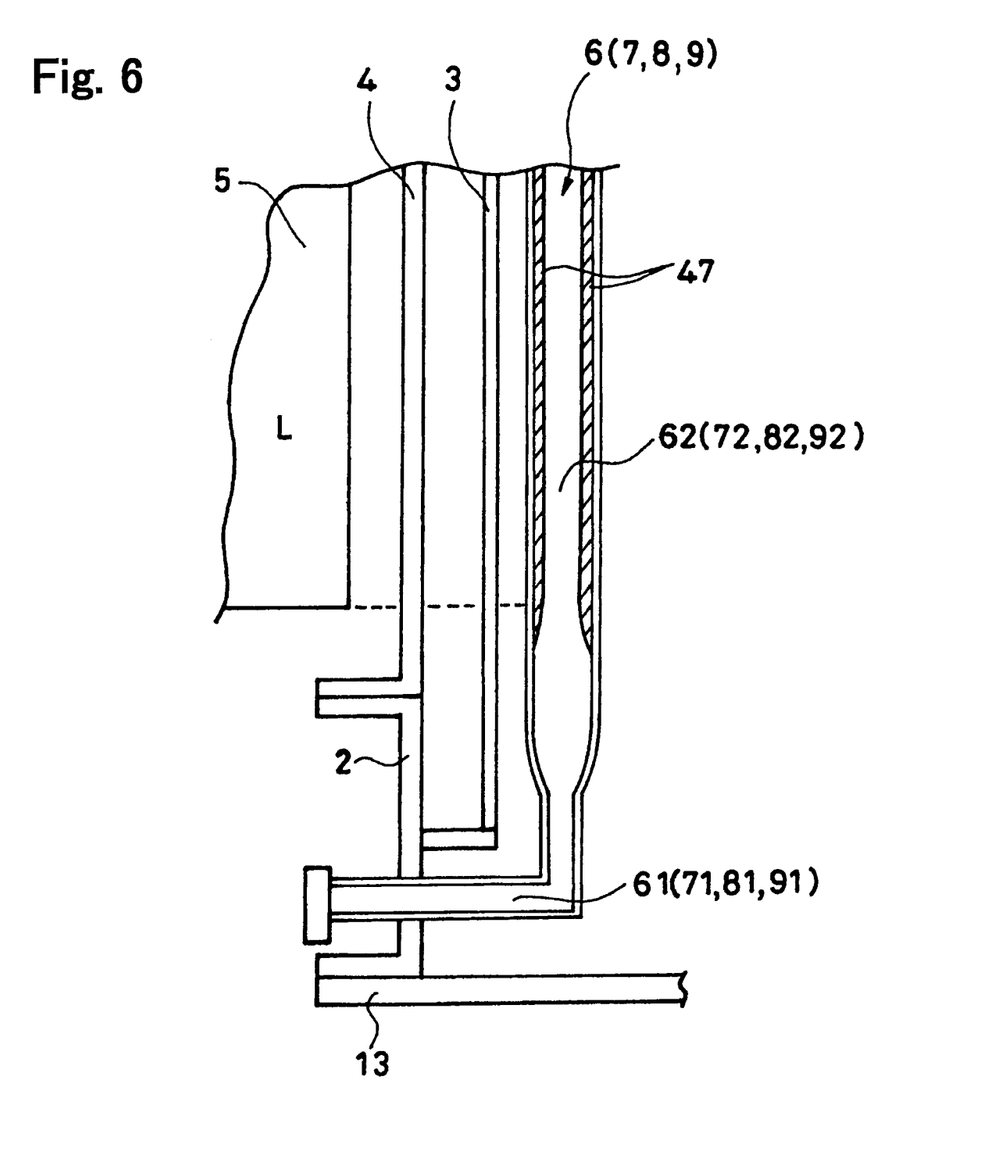
FIG. 6 is a schematic partial vertical sectional view for explaining a state in which reaction product adheres to a gas introduction nozzle.

Reaction gas is heated by the heater 5 during the process in which the reaction gas passes through the tube shaft intersecting portions 61, 71, 81 and 91 and flows upward in the tube shaft parallel portions 62, 72, 82 and 92. Therefore, while the reaction gas passes through the tube shaft parallel portions 62, 72, 82 and 92, reaction product adheres to inner surfaces of the tube shaft parallel portions 62, 72, 82 and 92 in some cases. As described above, portions of the tube shaft parallel portions 62, 72, 82 and 92 which are opposed at least to the heater 5 are large in diameters. Thus, even if reaction product 47 adheres as shown in FIG. 6, the gas introducing nozzles 6, 7, 8 and 9 are not clogged.

Further, since the temperatures in the tube shaft intersecting portions 61, 71, 81 and 91 are low and reaction does not proceed and thus, the diameters of the tube shaft intersecting portions 61, 71, 81 and 91 may be left thin. As shown in FIG. 3, joint portion areas between the tube shaft intersecting portions 61, 71, 81 and 91 and the tube shaft parallel portions 62, 72, 82 and 92, or portions of the tube shaft parallel portions 62, 72, 82 and 92 which are not opposed to the heater 5 and which rise from the tube shaft intersecting portions 61, 71, 81 and 91 are small in diameters because temperatures thereof are less than 300 to 400° C. and reaction does not proceed.

Even the portions of the tube shaft parallel portions 62, 72, 82 and 92 opposed to the heater 5, temperatures in lower portions of these portion are less than 300 to 400° C. and these portions are not heated so much and thus, these lower portion may be left small in diameters. Portions of the tube shaft parallel portions 62, 72, 82 and 92 which are increased on flow-path cross sections and which are opposed to the heater 5 may be defined as regions where the wafers 30 are accommodated.

Therefore, even when films are repeatedly formed, clogging of the nozzle can be suppressed, the supply amount of reaction gas from the gas introducing nozzles 6, 7, 8 and 9 does not become insufficient, and substrates can be processed with excellent quality. Effect can be expected in forming processing of polycrystalline silicon thick film, preferably flat polycrystalline silicon thick film. The present invention can also be applied to forming processing of SiGe films which is carried out using silane-based gas such as $SiH_4$ and germane-based gas such as $GeH_4$.

A portion of the nozzle where it is required to increase a flow-path cross-sectional area is a portion whose temperature becomes such a degree that film-forming reaction is generated (portion where its temperature becomes 300 to 400° C. or higher in the case of $SiH_4$), or a portion whose temperature becomes such a degree that reaction gas is dissolved (portion where its temperature becomes 300 to 400° C. or higher in the case of $SiH_4$).

A portion of the nozzle where it is not required to increase the flow-path cross-sectional area is a nozzle-attaching portion, a nozzle horizontal portion, a nozzle bent portion, a portion which is not opposed to the heater, and a portion whose temperature becomes such a degree that film-forming reaction is not generated (portion where its temperature becomes less than 300 to 400° C. in the case of $SiH_4$), or a portion whose temperature becomes such a degree that reaction gas is not dissolved (portion where its temperature becomes less than 300 to 400° C. in the case of $SiH_4$).

Figure 5:
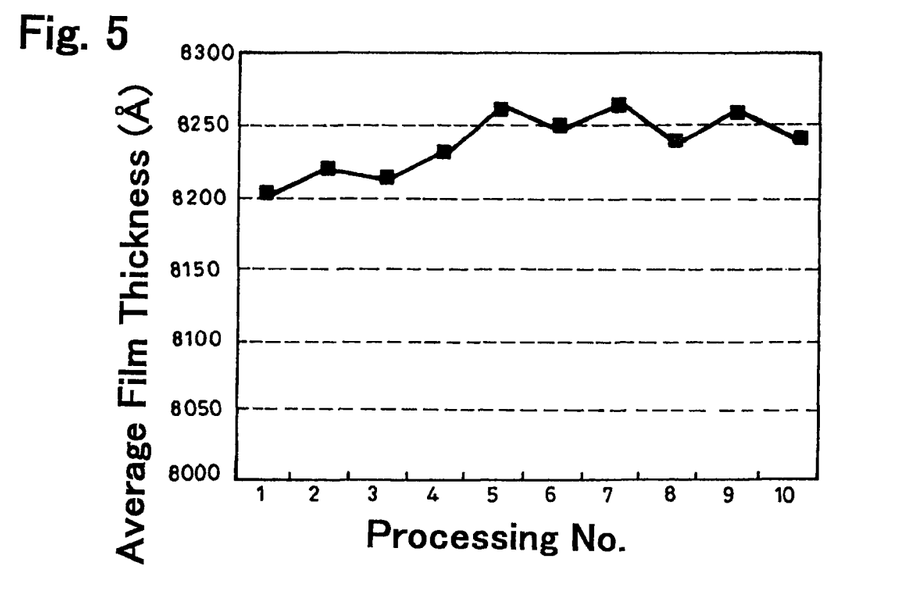
FIG. 5 shows variation in thicknesses of films formed on wafers when batch processing is carried out in the substrate processing apparatus according to the one example of the present invention.

FIG. 5 shows variation in thicknesses of films formed on wafers when batch processing is carried out in a substrate processing apparatus of the present invention.

Preferable processing conditions are that film-forming temperature, i.e., temperature in a region of at least the processing chamber 16 where the wafers 30 are accommodated is 650 to 670° C., film-forming pressure is 10 to 30 Pa, thickness of formed film is 5,000 to 10,000 Å, and reaction gas flow rate ($SiH_4$, total flow rate: 0.2 to 1 SLM).

FIG. 5 shows a case in which the batch processing is repeated ten times under the above processing conditions. There is a tendency that the average film thickness (average film thickness value of wafers subjected to the same batch processing) is gradually increased with each batch processing, but the uniformity of film thicknesses with each batch processing is ±0.38% and falls within a range where product quality is not harmed, clogging of the nozzle can be suppressed, and the supply amount of reaction gas does not become insufficient. Conventionally, the nozzle is clogged after batch processing is repeated three to four times, but according to this embodiment, it has been confirmed that the batch processing can be carried out ten or more times.

If the mass flow controllers 18, 19, 20, 21 and 22 are controlled by collecting data concerning uniformity of film thicknesses with every batch processing and by grasping the tendency, and if the flow rate is controlled with each batch processing, the uniformity of film thicknesses is enhanced.

Although the film-forming temperature is 650 to 670° C. in the above embodiment, the film-forming temperature may be 620° C. or higher. For example, the film-forming temperature may be 620 to 680° C. The tube shaft parallel portions 62, 72, 82 and 92 can be produced by crushing tubes of ⅜ inches for example. Cross-sectional shapes of the tube shaft parallel portions are not limited to circular, long circular or elliptic shape. The cross-sectional shape may be arc long circular shape or a rectangular having long sides in the circumferential direction. In short, the cross-sectional shape is not limited only if the flow-path cross section can be enlarged. Preferable examples of the cross-sectional shape are squashy circular shape, substantially elliptic shape, crushed circular shape (elliptic shape, egg-like shape, rounded rectangular shape, shape in which ends of opposed semi-circles are connected with each other through straight lines), substrate elliptic shape in which short axis is oriented toward a central portion of a substrate, a substantially elliptic shape having short axis in a direction of a straight line which connects a center of a substrate and a center of a nozzle, a substantially elliptic shape having long axis in a direction substantially perpendicular to a straight line which connects the center of the substrate and the center of the nozzle, a shape in which a width in a direction of a straight line which connects the center of the substrate and the center of the nozzle is smaller than a width in a direction which is substantially perpendicular to the former width, a rectangular shape having long sides in a direction substantially perpendicular to the straight line which connects the center of the substrate and the center of the nozzle, and a rhombus shape having long sides in a direction substantially perpendicular to the straight line which connects the center of the substrate and the center of the nozzle. FIGS. 8A to 12B show such modifications.

The present invention can also be carried out even if the reaction furnace is a lateral reaction furnace.

As explained above, in this embodiment, the flow-path cross-sectional area of a portion of the nozzle that is opposed at least to the heater is set greater than the flow-path cross-sectional area of the attaching portion of the nozzle on the reaction container. Therefore, it is possible to suppress the clogging of the nozzle, and to increase the number of processing which can be carried out until maintenance is required. With this, a frequency of the maintenance can be reduced (maintenance cycle can be increased), and downtime of the apparatus can be reduced.

The flow-path cross-sectional area of the attaching portion of the nozzle on the reaction container is not increased and the same shape as that of the conventional technique (¼ inch diameter) can be employed and thus, a furnace opening flange having the same shape as that of the conventional technique (corresponding to nozzle of ¼ inch diameter) can be used as it is, and it is unnecessary to newly design the furnace opening flange. When the flow-path cross-sectional area of the entire nozzle is increased, it is necessary to newly design (change the design of) the furnace opening flange such in accordance with the changed nozzle shape.

Since the cross-sectional shape of the portion of the nozzle that is opposed to the heater is the squashy circular shape (elliptic shape), clearance between the wafer and the inner tube can be reduced. With this, the gas concentration over the entire surface of a substrate can be equalized, and uniformity of film thickness over the entire surface of the substrate and uniformity of film quality over the entire surface of the substrate can be enhanced. Further, the volume of the reaction tube can be reduced, and an amount of gas to be used can be saved. Further, the apparatus can be reduced in size.

The entire disclosures of Japanese Patent Application No. 2003-206526 filed on Aug. 7, 2003 and Japanese Patent Application No. 2004-096063 filed on Mar. 29, 2004 each including specification, claims, drawings and abstract are incorporated herein by reference in those entirety.

Although various exemplary embodiments have been shown and described, the invention is not limited to the embodiments shown. Therefore, the scope of the invention is intended to be limited solely by the scope of the claims that follow.

INDUSTRIAL APPLICABILITY

As explained above, according to the embodiment of the present invention, in a substrate processing apparatus having a reaction tube which processes a plurality of substrates, a heater which heats the substrates, and at least one gas introduction nozzle through which gas is supplied into the reaction tube, a flow-path cross section of a portion of the gas introduction nozzle that is opposed at least the heater is greater than flow-path cross section of other portion. Therefore, it is possible to exhibit excellent effects that when films are to be formed, clogging of the gas introduction nozzle can be suppressed, maintenance operation is reduced, maintenance cycle can be shortened, and throughput can be enhanced.

As a result, the present invention can suitably be utilized especially for a vertical CVD apparatus which produces a semiconductor device on a silicon wafer, and for a producing method of a semiconductor device which uses this CVD apparatus.

The invention claimed is:
1. A substrate processing apparatus, comprising:
a reaction container to process a plurality of substrates;
a heater to heat said plurality of substrates; and
at least one nozzle through which reaction gas is to be supplied into said reaction container, wherein said nozzle includes a horizontal portion extending in a horizontal direction and a vertical portion rising in a vertical direction, said horizontal portion is attached to a sidewall of said reaction container with said horizontal portion penetrating the sidewall of said reaction container, said vertical portion is disposed in said reaction container apart from an inner wall of said reaction container such that a portion of the vertical portion is opposed to said heater, a flow-path cross-sectional area of a first portion of said vertical portion that is opposed to at least said heater is greater than a flow-path cross-sectional area of said horizontal portion, a flow-path cross-sectional shape of said first portion of said vertical portion that is opposed to at least said heater is formed into a substantially elliptic shape with a short axis thereof oriented toward a central portion of the substrate, said vertical portion that is not opposed to said heater includes a second portion, wherein a flow-path cross-sectional area of said section portion is smaller than the flow-path cross-sectional area of said first portion, and a flow-path cross-sectional shape of said second portion is formed into a circular shape, and the short axis of the substantially elliptic shape of the flow-path cross-sectional shape of said first portion is substantially equal to the diameter of the circular shape of the flow-path cross-sectional shape of said second portion, thus providing a substantially equivalent lateral clearance between the nozzle and the plurality of substrates at the first and second portions.

2. A substrate processing apparatus as recited in claim 1, wherein said cross-sectional shape of the horizontal portion of said nozzle is formed into a circular shape.

3. The substrate processing apparatus as recited in claim 1, wherein said vertical portion of said nozzle that is not opposed to said heater includes a third portion which is formed so that an inner diameter increases according to an inclination from said second portion to said first portion, wherein the short axis of the substantially elliptic shape of the flow-path cross-sectional shape of said first portion is substantially equal to the diameter of the circular shape of the flow-path cross-sectional shape of said second portion, thus providing a substantially equivalent lateral clearance between the nozzle and the plurality of substrates at the first and second portions.

4. The substrate processing apparatus as recited in claim 1, wherein said first portion of said nozzle is provided in a position which is to be at a processing temperature when said plurality of substrates are processed, and said second portion of said nozzle is provided in a position which is to be at a temperature lower than said processing temperature.

5. The substrate processing apparatus as recited in claim 1, wherein said first portion of said nozzle is provided in a position which is to be at a temperature at which a film-forming reaction is generated, and said second portion of said nozzle is provided in a portion which is to be at a temperature at which a film-forming reaction is not generated.

6. The substrate processing apparatus as recited in claim 1, wherein said first portion of said nozzle is provided in a position which is to be at a temperature at which reaction gas is dissolved, and said second portion of said nozzle is provided in a position which is to be at a temperature at which reaction gas is not dissolved.

7. The substrate processing apparatus as recited in claim 1, wherein a plurality of gas ejection ports are provided in said first portion of said nozzle.

8. A substrate processing apparatus, comprising:

a reaction container to process a plurality of substrates;

a heater to heat said plurality of substrates; and a plurality of nozzles through which reaction gas is to be supplied into said reaction container, wherein each of said plurality of nozzles includes a horizontal portion extending in a horizontal direction and a vertical portion rising in a vertical direction, said horizontal portion is attached to a sidewall of said reaction container with said horizontal portion penetrating the sidewall of said reaction container, said vertical portion is disposed in said reaction container apart from an inner wall of said reaction container such that a portion of the vertical portion is opposed to said heater, a flow-path cross-sectional area of a first portion of said vertical portion that is opposed to at least said heater is greater than a flow-path cross-sectional area of said horizontal portion, and a flow-path cross-sectional shape of said first portion of said vertical portion that is opposed to at least said heater is formed into a substantially elliptic shape with a short axis thereof oriented toward a central portion of the substrate, said vertical portion that is not opposed to said heater includes a second portion, wherein a flow-path cross-sectional area of said section portion is smaller than the flow-path cross-sectional area of said first portion, and a flow-path cross-sectional shape of said second portion is formed into a circular shape, and the short axis of the substantially elliptic shape of the flow-path cross-sectional shape of said first portion is substantially equal to the diameter of the circular shape of the flow-path cross-sectional shape of said second portion, thus providing a substantially equivalent lateral clearance between the nozzle and the plurality of substrates at the first and second portions.

9. A substrate processing apparatus as recited in claim 8, wherein said flow-path cross-sectional shape of the horizontal portion of each of said plurality of nozzles is formed into a circular shape.

10. The substrate processing apparatus as recited in claim 8, wherein said vertical portion of each of said plurality nozzles that is not opposed to said heater includes a third portion which is formed so that an inner diameter increases according to an inclination from said second portion to said first portion.

11. The substrate processing apparatus as recited in claim 8, wherein said first portion of each of said plurality of nozzles is provided in a position which is to be at a processing temperature when said plurality of substrates are processed, and said second portion of each of said plurality of nozzles is provided in a position which is to be at a temperature lower than said processing temperature.

12. The substrate processing apparatus as recited in claim 8, wherein said first portion of each of said plurality of nozzles is provided in a position which is to be at a temperature at which a film-forming reaction is generated, and said second portion of each of said plurality of nozzles is provided in a portion which is to be at a temperature at which a film-forming reaction is not generated.

13. The substrate processing apparatus as recited in claim 8, wherein said first portion of each of said plurality of nozzles is provided in a position which is to be at a temperature at which reaction gas is dissolved, and said second portion of each of said plurality of nozzles is provided in a position which is to be at a temperature at which reaction gas is not dissolved.

14. The substrate processing apparatus as recited in claim 8, wherein a plurality of gas ejection ports are provided in said first portion of each of said plurality of nozzles.

\* \* \* \* \*